United States Patent [19]
Hurd et al.

[11] Patent Number: 5,657,757
[45] Date of Patent: Aug. 19, 1997

[54] INTERLEAVED MR SPECTROSCOPY AND IMAGING WITH DYNAMICALLY CHANGING ACQUISITION PARAMETERS

[75] Inventors: Ralph Eugene Hurd, Milpitas; Napapon Sailasuta, Morgan Hill, both of Calif.; Susan Jean Kohler, Concord, Mass.

[73] Assignee: General Electric Company, Milwaukee, Wis.

[21] Appl. No.: 516,265

[22] Filed: Aug. 17, 1995

[51] Int. Cl.$^6$ .................................................. G01R 33/20
[52] U.S. Cl. ....................... 128/653.2; 324/307; 324/309; 324/312
[58] Field of Search ......................... 128/653.2; 324/307, 324/309, 312

[56] References Cited

U.S. PATENT DOCUMENTS

| | | |
|---|---|---|
| 4,734,646 | 3/1988 | Shenoy et al. . |
| 4,832,037 | 5/1989 | Granot . |
| 5,237,273 | 8/1993 | Plewes et al. . |
| 5,239,266 | 8/1993 | Kaufman et al. . |

Primary Examiner—William E. Kamm
Assistant Examiner—Shawna J. Shaw
Attorney, Agent, or Firm—Quarles & Brady

[57] ABSTRACT

An MRS or MRI scan is performed by interleaving pulse sequences which acquire MR spectra or images from different locations in a subject. Parameters for the pulse sequence used to acquire MR data at each location are dynamically changed during the scan to optimize the MR measurements.

10 Claims, 4 Drawing Sheets

INTERLEAVED MR SPECTROSCOPY AND IMAGING WITH DYNAMICALLY CHANGING ACQUISITION PARAMETERS

BACKGROUND OF THE INVENTION

The field of the invention is magnetic resonance spectroscopy ("MRS") and imaging ("MRI"). More particularly, the invention relates to the acquisition of spectra and images from multiple regions of a subject.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated and this signal may be received and processed to provide a spectrum.

Magnetic field gradients ($G_x$, $G_y$ and $G_z$) are employed to localize the region in the object from which the spectra or images are obtained. In point resolved spectroscopy (PRESS), for example, gradient fields are used in combination with selective RF pulses to acquire spectra from a voxel located at the intersection of three orthogonal slices. On the other hand, in spectroscopic imaging (SI) one gradient field is used in combination with a selective RF pulse to excite spins in a slice, and the other two gradients are used to phase encode the acquired NMR spectra and localize signals to voxels in the slice.

Recent MRS applications employ long repetition rates (TR) to allow full recovery of the longitudinal spin magnetization between acquisitions. Since it is common to average from 64 to 256 acquisitions from the same location, the time needed to acquire spectra from a single location is quite long. The time needed to acquire successive MR spectra from different locations in the subject thus becomes prohibitive.

In conventional MRI, this problem is solved by interleaving acquisitions from different slice locations. While the longitudinal magnetization in one slice is recovering, image data is acquired from the remaining separate slices. Thus, during the time needed to scan one slice, image data is acquired for many slices. This solution is possible in conventional MRI because the same pulse sequence is used to scan all of the interleaved slices—only the slice location is changed. A single adjustment of homogeneity, pulse power and frequency is made for all slices. In MRS and in chemical shift sensitive MRI (e.g. chemical shift selective fat saturation) a single static adjustment of these parameters is often unacceptable.

Depending on the particular spectrum being obtained, a number of spectroscopy pulse sequence parameters are usually adjusted to obtain the desired information from a location in a subject. For example, the size of the voxel may be different, shim coil corrections may be different, and water or fat suppression preparatory pulses may be different. Consequently, it is not possible to simply interleave spectroscopy acquisitions as is done with conventional MRI.

SUMMARY OF THE INVENTION

The present invention is a method and apparatus for interleaving the acquisition of MRS and MRI data by dynamically changing the pulse sequence parameters prior to each acquisition such that the resulting spectra or images are optimal for each location. More specifically, optimal spectroscopic pulse sequence parameters are stored for each of the interleaved acquisitions, and the MR system is operable to dynamically change its pulse sequence during the scan in accordance with the stored pulse sequence parameters. The spectroscopic or imaging acquisition from a plurality of locations in the object are thus interleaved, and the optimal spectroscopic pulse sequence parameters are used for each acquisition.

A general object of the invention is to interleave MR spectroscopy and imaging acquisitions in a single scan. By dynamically altering pulse sequence parameters for each separate acquisition, the optimal MRI and MRS pulse sequence is used at each location.

DESCRIPTION OF THE PREFERRED EMBODIMENT

Figure 1:
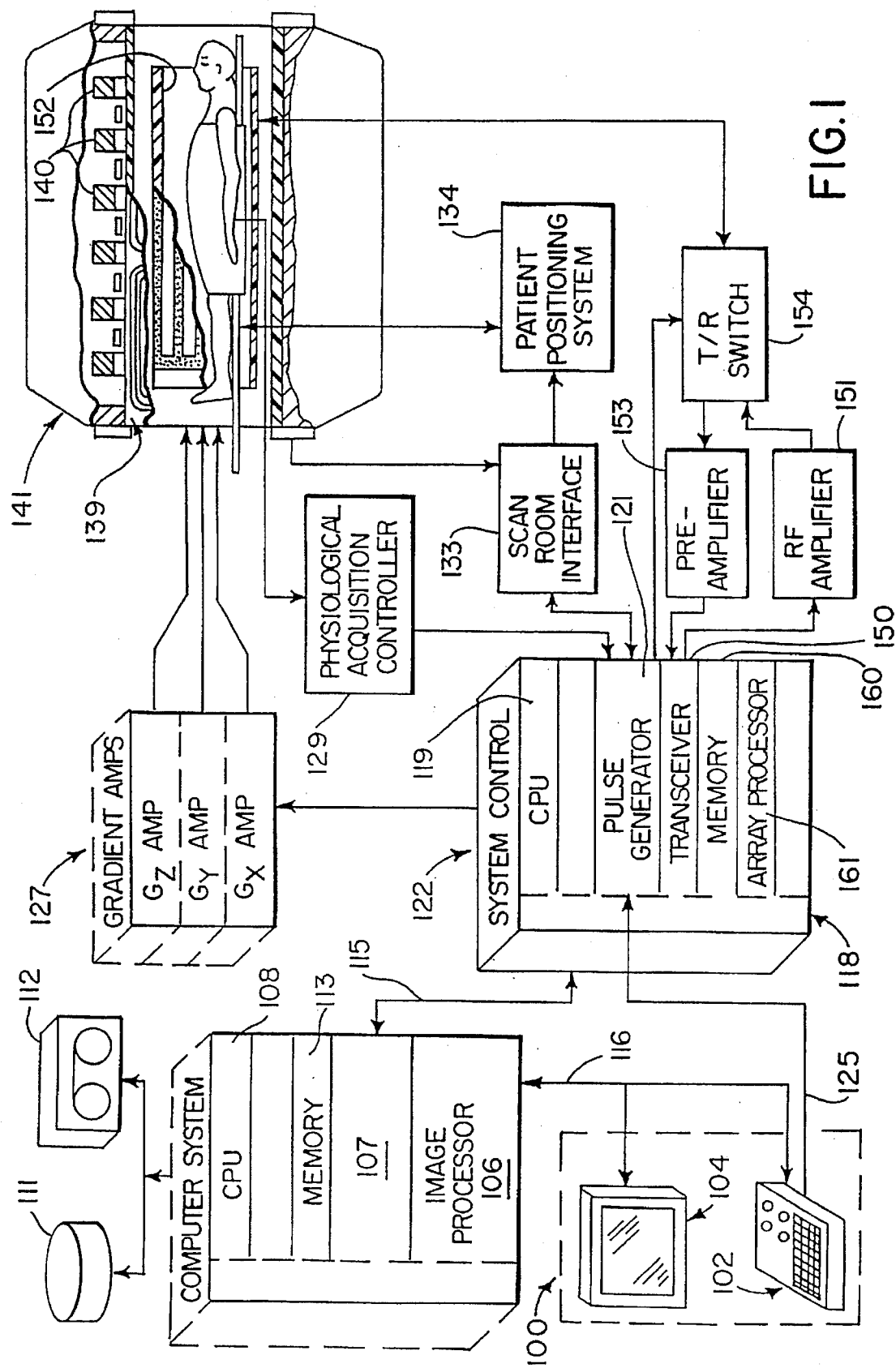
FIG. 1 is a block diagram of an MR system which employs the present invention.

Referring first to FIG. 1, there is shown the major components of a preferred MR system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 112 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan as well as any shim fields that are to be produced to improve $B_0$ homogeneity in the location from which spectra is to be acquired. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

Figure 5:
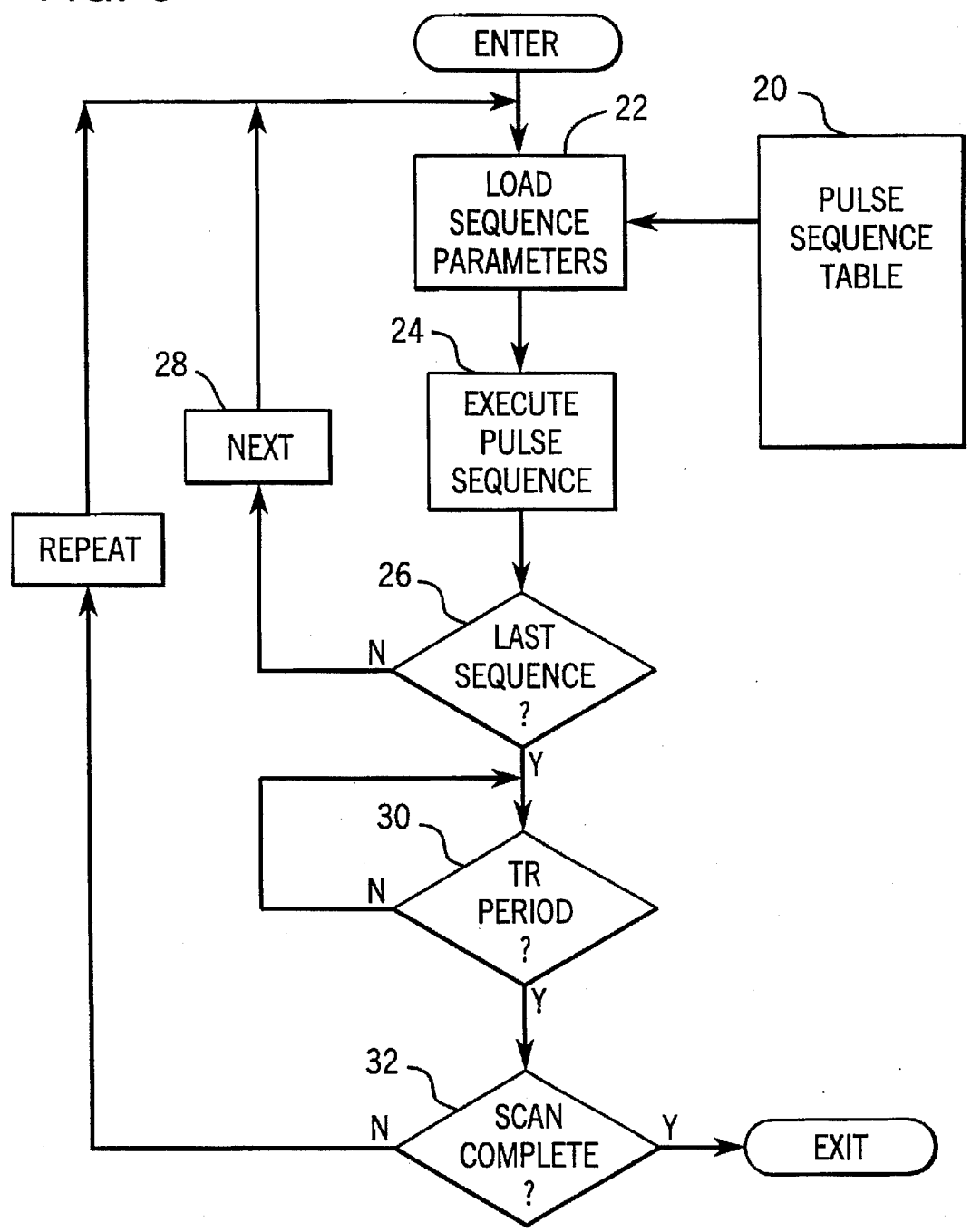
FIG. 5 is a flow chart illustrating the preferred method of practicing the present invention on the MR system of FIG. 1.

When an interleaved spectroscopic scan is to be performed, the operator downloads to the CPU module 119 the pulse sequence parameters for each interleaved acquisition. These are stored in a table along with an indication of the order each is to be performed. As shown in FIG. 5, the CPU module 119 is programmed to carry out an interleaved scan in which these pulse sequence parameters are sequentially read from the table and used by the pulse generator module 121 to perform separate spectroscopic acquisitions.

Referring particularly to FIG. 5, when the scan is started the parameters for the first interleaved spectroscopic acquisition are read from a pulse sequence table 20 as indicated by process block 22. These are downloaded to the pulse generator module 121 and the pulse sequence is executed as indicated at process block 24. As with multi-slice imaging, the acquired MR data is separately processed and stored. The system then loops back at decision block 26 and the next set of pulse sequence parameters are pointed to at process block 28. This loop is repeated until each interleaved spectroscopic pulse sequence is executed once with its particular set of stored parameters.

After all interleaved measurements are made once, the system waits at decision block 30 for the selected TR period to expire. If a large number of measurements are interleaved, this wait may be very brief and the scan is performed with maximum efficiency.

After the TR period expires, a test is made at decision block 32 to determine if the scan is complete. Typically, the interleaved acquisition will be repeated from 64 to 128 times in order to average the results and improve the SNR of the acquired spectra at each selected location.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals and producing shim fields. These gradient fields are also used to "shim" the polarizing magnetic field to insure its homogeneity at the location from which MR data is acquired.

The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data as required. This transformed data is conveyed through the serial link 115 to the computer system 107 where it is stored in the disk memory 111. In response to commands received from the operator console 100, this transformed data may be archived on the tape drive 112, or it may be further processed by the image processor 106 and conveyed to the operator console 100 and presented on the display 104.

Figure 2:
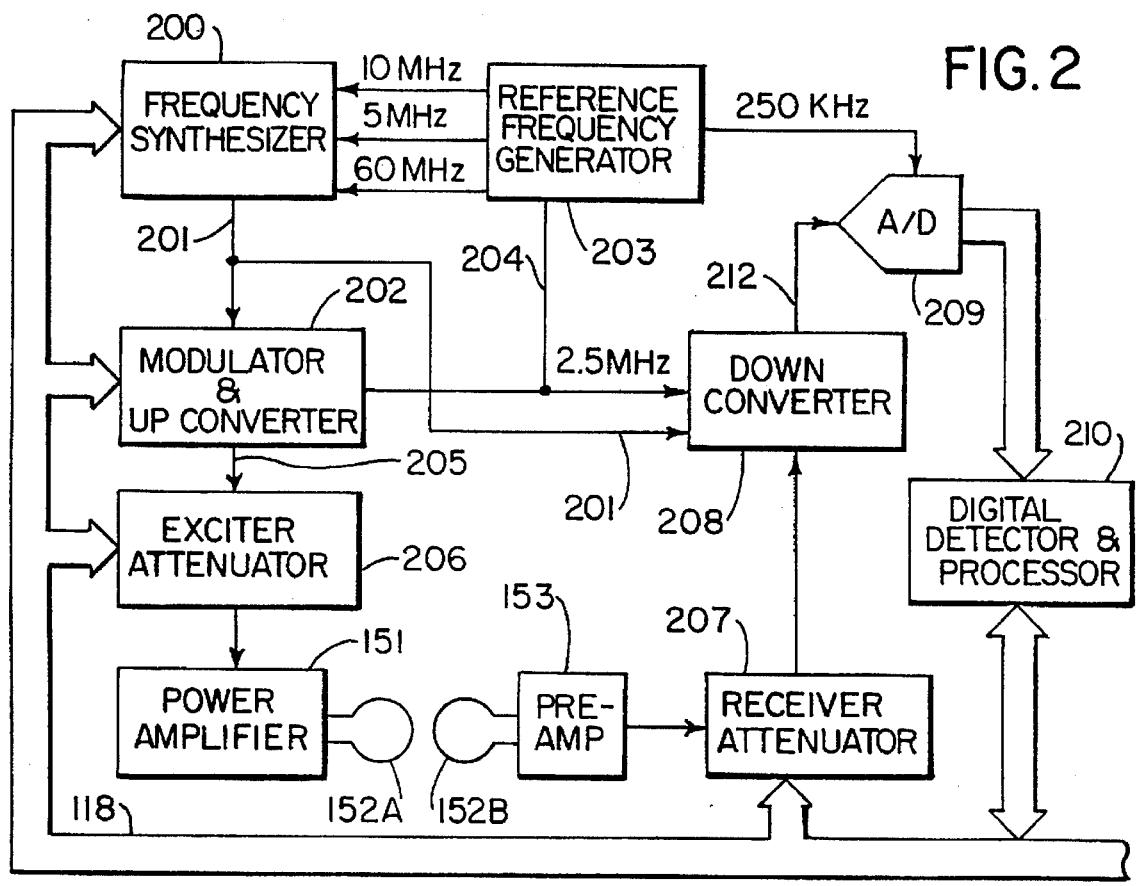
FIG. 2 is an electrical block diagram of the transceiver which forms part of the MR system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the MR signal with the carrier signal on line 201 and then mixes the resulting difference signal with the 2.5 MHz reference signal on line 204. The down converted MR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
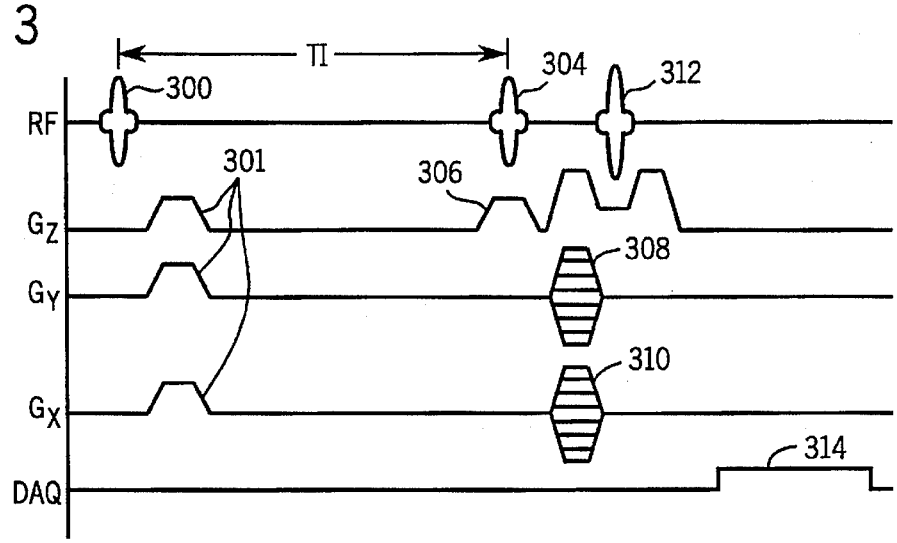
FIG. 3 is a graphic representation of a spectroscopic imaging pulse sequence which may be employed in the MR system of FIG. 1.
Figure 4:
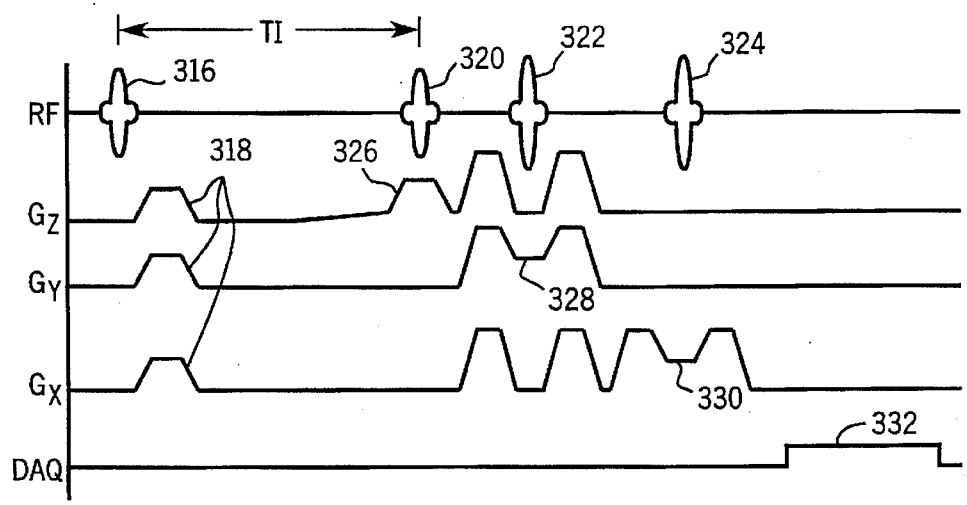
FIG. 4 is a graphic representation of a PRESS pulse sequence which may be employed in the MR system of FIG. 1.

Referring particularly to FIG. 3, a spectroscopy imaging pulse sequence may be used to perform an interleaved scan according to the present invention. In this embodiment, spectra are acquired from a plurality of different slices through the subject, and the parameters for the pulse sequence of FIG. 3 are finely adjusted for each slice. An inversion recovery preparatory RF pulse 300 followed by spoiler gradients 301 are used to suppress signals from fat or water as determined by the time period TI. The success of this suppression method is strongly dependent on the $B_0$ field homogeneity, RF frequency and RF power in the slice from which spectra are acquired. Accordingly, these parameters are separately determined for each slice location. $B_0$ field homogeneity is separately trimmed for each slice by applying appropriate gradient fields to shim the $B_0$ field in each slice. Similarly, the RF power is adjusted so the RF inversion pulse 300 produces the desired flip angle in the slice and the frequency of the pulse 300 is set to water or fat spin.

Following the preparatory phase of the pulse sequence, transverse magnetization is produced in the slice by a selective RF excitation pulse 304 applied in the presence of $G_z$ slice select gradient 306. $G_x$ and $G_y$ phase encoding pulses 308 and 310 are then applied and a 180° RF rephasing pulse 312 is applied to produce a spin echo MR signal that is acquired in a data acquisition window 314. The frequency and power of the RF pulses 304 and 312 are adjusted separately for each slice in the scan, and $B_0$ field homogeneity is separately trimmed for each slice. By separately adjusting these pulse sequence parameters for each slice of the interleaved scan, accurate spectra can be acquired.

Referring particularly to FIG. 5, a point resolved spectroscopy (PRESS) pulse sequence also includes a preparatory phase in which a signal from water or fat spins is suppressed by an RF inversion pulse 316 and spoiler gradients 318. As in the SI pulse sequence discussed above, the frequency and power of the RF pulse 316 is separately adjusted for each voxel from which spectra is to be acquired, and the $B_0$ field is separately shimmed.

The location, size and shape of each voxel from which spectra are acquired is determined by three selective RF pulses 320, 322 and 324 played out in the presence of respective $G_z$, $G_y$ and $G_x$ slice select gradient pulses 326, 328 and 330. The RF pulse 320 is a selective 90° excitation pulse which produces transverse magnetization in an x-y slice having a location and thickness along the z-axis determined by the frequency and bandwidth of the RF pulse 320 and the magnitude of the $G_z$ gradient 326. The RF pulse 322 is a 180° rephasing pulse which selects a line in the excited x-y plane and the RF pulse 324 is a 180° rephasing pulse which selects a voxel along that line. The precise frequency and bandwidth of the pulses 322 and 324, as well as the strength of gradient pulses 328 and 330, determine the location and size of the voxel along respective y and x gradient axes. The parameters for the inversion recovery preparation as well as those for the size and location of the selected voxel are dynamically changed during the interleaved scan. In addition, the $B_0$ field is separately shimmed at each voxel location by dynamically changing shim gradient fields. The latter adjustment is particularly important when the spectrum is acquired during a data acquisition window 332.

It should be apparent to those skilled in the art that the present invention can be used on any spectroscopic or imaging pulse sequence in which multiple, interleaved acquisitions are desirable. Those parameters which insure accurate spectra at each location are dynamically adjusted during the scan.

We claim:

1. A method for acquiring during a single scan MR data from a plurality of locations in a subject placed in a polarizing field of a MR system, the steps comprising:
   a) downloading a first set of MR pulse sequence parameters to a pulse generator in the MR system;
   b) executing a first MR pulse sequence with the MR system using the first set of MR pulse sequence parameters;
   c) acquiring MR data from a first location in the subject and storing it in a first data set;
   d) downloading a second set of MR pulse sequence parameters to the pulse generator in the MR system;
   e) executing a second MR pulse sequence with the MR system using the second set of MR pulse sequence parameters;
   f) acquiring MR data from a second location in the subject and storing it in a second data set; and
   g) repeating steps a) through f) until the first and second data sets are complete; and
in which the MR pulse sequence parameters include the value of gradient fields applied to trim the polarizing field homogeneity in the location from which MR data is acquired.

2. The method as recited in claim 1 in which additional sets of MR pulse sequence parameters are downloaded to the pulse generator, corresponding additional MR pulse sequences are executed and MR data are acquired from corresponding additional locations in the subject and stored in corresponding additional data sets during the scan.

3. The method as recited in claim 1 in which the MR pulse sequence parameters include the frequency of an RF pulse employed to suppress the MR signal from a particular spin species.

4. The method as recited in claim 1 in which the MR pulse sequence parameters include the value of gradient fields employed in the MR pulse sequence to establish the location, shape and size of the location from which MR data are acquired.

5. The method as recited in claim 1 in which the MR pulse sequence is a spectroscopic pulse sequence and the MR data is MR spectra.

6. A method for acquiring during a single scan MR data from a plurality of locations in a subject placed in a polarizing field of a MR system, the steps comprising:
   a) downloading a first set of MR pulse sequence parameters to a pulse generator in the MR system;
   b) executing a first MR pulse sequence with the MR system using the first set of MR pulse sequence parameters;
   c) acquiring MR data from a first location in the subject and storing it in a first data set;
   d) downloading a second set of MR pulse sequence parameters to the pulse generator in the MR system;
   e) executing a second MR pulse sequence with the MR system using the second set of MR pulse sequence parameters;
   f) acquiring MR data from a second location in the subject and storing it in a second data set; and g) repeating steps a) through f) until the first and second data sets are complete; and in which the MR pulse sequence parameters include RF power which is optimized to compensate for variations in the $B_1$ excitation field at said first and second locations.

7. The method as recited in claim 6 in which additional sets of MR pulse sequence parameters are downloaded to the pulse generator, corresponding additional MR pulse sequences are executed and MR data are acquired from corresponding additional locations in the subject and stored in corresponding additional data sets during the scan.

8. The method as recited in claim 6 in which the MR pulse sequence parameters include the frequency of an RF pulse employed to suppress the MR signal from a particular spin species.

9. The method as recited in claim 6 in which the MR pulse sequence parameters include the value of gradient fields employed in the MR pulse sequence to establish the location, shape and size of the location from which MR data are acquired.

10. The method as recited in claim 6 in which the MR pulse sequence is a spectroscopic pulse sequence and the MR data is MR spectra.

* * * * *